(12) United States Patent
Eaton et al.

(10) Patent No.: US 6,169,416 B1
(45) Date of Patent: Jan. 2, 2001

(54) PROGRAMMING ARCHITECTURE FOR FIELD PROGRAMMABLE GATE ARRAY

(75) Inventors: David D. Eaton, San Jose; Paige A. Kolze, Mountain View, both of CA (US)

(73) Assignee: QuickLogic Corporation, Sunnyvale, CA (US)

( * ) Notice: Under 35 U.S.C. 154(b), the term of this patent shall be extended for 0 days.

(21) Appl. No.: 09/145,581

(22) Filed: Sep. 1, 1998

(51) Int. Cl.[7] ................................................ H03K 19/173
(52) U.S. Cl. ................................ 326/38; 326/41; 327/525
(58) Field of Search ........................ 326/37–39; 327/525

(56) References Cited

U.S. PATENT DOCUMENTS

| 4,439,804 | 3/1984 | Riddle et al. . |
| 4,758,745 | 7/1988 | Elgamal et al. . |
| 4,857,774 | 8/1989 | El-Ayat et al. . |
| 4,873,459 | 10/1989 | El Gamal et al. . |
| 4,910,417 | 3/1990 | El Gamal et al. . |
| 5,015,885 | 5/1991 | El Gamal et al. . |
| 5,053,909 | 10/1991 | Suzuki et al. . |
| 5,055,718 | 10/1991 | Galbraith et al. . |
| 5,073,729 | 12/1991 | Green et al. . |
| 5,083,083 | 1/1992 | El-Ayat et al. . |
| 5,122,685 | 6/1992 | Chan et al. . |
| 5,132,563 | 7/1992 | Fujii et al. . |
| 5,132,571 | 7/1992 | McCollum et al. . |
| 5,172,014 | 12/1992 | El Gamal et al. . |
| 5,187,393 | 2/1993 | El Gamal et al. . |

(List continued on next page.)

OTHER PUBLICATIONS

S. Brown, et al., "Field Programmable Gate Arrays", pp. 1–43 and 88–202 (1992).

S. Trimberger, "Field Programmable Gate Array Technology", pp. 1–14 and 98–170 (1994).

D. Pellerin, et al., "Practical Design Using Programmable Logic", pp. 84–98 (1991).

Advanced Micro Devices, PAL Device Book and Design Guide, pp. 2–236 through 2–247 (1993).

QuickLogic Data Book, pp. 1–5 through 2–11 and 6–3 through 6–18 (1995).

Actel FPGA Data Book and Design Guide, pp. ix–xv, 1–5 through 1–34, 1–51 through 1–101, 1–153 through 1–222, 3–1 through 4–56 (1995).

Xilinx, "The Programmable Gate Array Design Handbook", First Edition, pp. 1–9 through 2–73 (1986).

*Primary Examiner*—Jon Santamauro
(74) *Attorney, Agent, or Firm*—Skjerven Morrill MacPherson LLP; Alan H. MacPherson; Michael J. Halbert (57) ABSTRACT

The programmable logic of a programmable device is sectioned into four logic regions. Each logic region includes logic elements and a programmable interconnect structure employing antifuses for programmably interconnecting selected ones of those logic elements. Programming conductors for supplying programming current to antifuses of a logic region extend across the logic region but do not extend across other logic regions. Similarly, programming control conductors that control programming transistors of the logic region extend across the logic region but do not extend across other logic regions. The programmable device structure allows four antifuses to be programmed simultaneously, one antifuse in each logic region. An antifuse can be selected for simultaneous programming from a logic region, irrespective of the other three antifuses that are or may be selected for simultaneous programming from the other three logic regions. Four programming current multiplexers and four programming buses are provided for each logic region so that the programming current that programs each antifuse flows from a separate input terminal. The resistance of the programming conductors is reduced by the use of parallel strips of metal in multiple metal layers.

23 Claims, 6 Drawing Sheets

U.S. PATENT DOCUMENTS

| | | |
|---|---|---|
| 5,191,241 | 3/1993 | McCollum et al. . |
| 5,196,724 | 3/1993 | Gordon et al. . |
| 5,208,530 | 5/1993 | El-Ayat et al. . |
| 5,220,213 | 6/1993 | Chan et al. . |
| 5,243,226 | 9/1993 | Chan . |
| 5,254,886 | 10/1993 | El Ayat et al. . |
| 5,294,846 | 3/1994 | Paivinen . |
| 5,302,546 | 4/1994 | Gordon et al. . |
| 5,304,871 | 4/1994 | Dharmarajan et al. . |
| 5,316,971 | 5/1994 | Chiang et al. . |
| 5,327,024 | 7/1994 | Cox . |
| 5,336,986 | 8/1994 | Allman . |
| 5,341,030 | 8/1994 | Galbraith . |
| 5,341,043 | 8/1994 | McCollum . |
| 5,347,519 | 9/1994 | Cooke et al. . |
| 5,367,207 | 11/1994 | Goetting et al. . |
| 5,371,414 | 12/1994 | Galbraith . |
| 5,391,942 | 2/1995 | El-Ayat et al. . |
| 5,397,939 | 3/1995 | Gordon et al. . |
| 5,414,364 | 5/1995 | McCollum . |
| 5,416,367 | 5/1995 | Chan et al. . |
| 5,424,655 | 6/1995 | Chua . |
| 5,448,184 * | 9/1995 | Paivinen ................................. 326/41 |
| 5,451,887 | 9/1995 | El-Avat et al. . |
| 5,469,077 | 11/1995 | Cox . |
| 5,469,396 | 11/1995 | Eltoukhy . |
| 5,477,165 | 12/1995 | ElAyat et al. . |
| 5,477,167 | 12/1995 | Chua . |
| 5,479,113 | 12/1995 | Gamal et al. . |
| 5,495,181 | 2/1996 | Kolze . |
| 5,502,315 | 3/1996 | Chua et al. . |
| 5,510,730 | 4/1996 | El Gamal et al. . |
| 5,525,909 | 6/1996 | McCollum . |
| 5,526,312 | 6/1996 | Eltoukhy . |
| 5,528,600 | 6/1996 | El Ayat et al. . |
| 5,534,793 | 7/1996 | Nasserbakht . |
| 5,537,056 | 7/1996 | McCollum . |
| 5,544,070 | 8/1996 | Cox et al. . |
| 5,552,720 | 9/1996 | Lulla et al. . |
| 5,557,136 | 9/1996 | Gordon et al. . |
| 5,572,476 | 11/1996 | Eltoukhy . |
| 5,594,361 | 1/1997 | Campbell . |
| 5,614,818 | 3/1997 | El Ayat et al. . |
| 5,654,649 | 8/1997 | Chua . |
| 5,661,412 | 8/1997 | Chawla et al. . |
| 5,825,201 * | 10/1998 | Kolze ................................. 326/41 |

\* cited by examiner

Key To
FIG. 4

FIG. 5

PROGRAMMING ARCHITECTURE FOR FIELD PROGRAMMABLE GATE ARRAY

BACKGROUND INFORMATION

Figure 1:
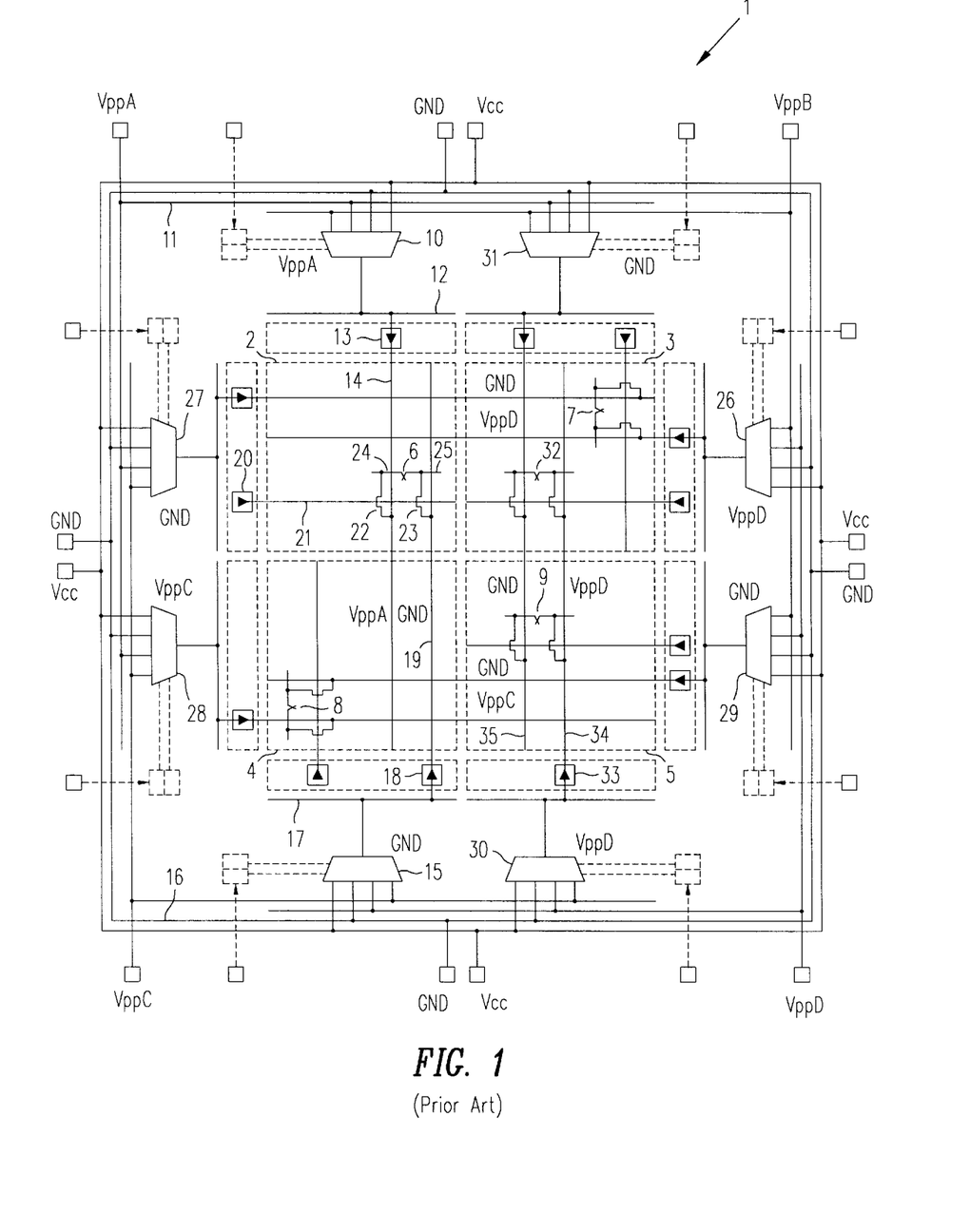
FIG. 1 (Prior Art) is a simplified top-down diagram off a conventional field programmable gate array (FPGA).

FIG. 1 (Prior Art) is a simplified top-down diagram of a programming structure of a field programmable gate array (FPGA) integrated circuit 1 employing antifuses. For additional background information on such an FPGA, its programming structure, and testing structures, see U.S. patent application Ser. No. 08/667,702, entitled "Programming Architecture For A Programmable Integrated Circuit Employing Antifuses", filed Jun. 21, 1996, by Kolze et al. now U.S. Pat. No. 5,825,201; and U.S. Pat. No. 5,495,181 entitled "Integrated Circuit Facilitating Simultaneous Programming Of Multiple Antifuses" by Kolze (the subject matter of this application and this patent is incorporated herein by reference in its entirety).

FPGA 1 includes four logic regions 2–5 of logic cells and programmable interconnect employing antifuses. Four of the antifuses can be programmed at once, one in each logic region. The programming current for each antifuse is supplied from a different programming current terminal so it can be assured that each of the four antifuses has been programmed with an adequate amount of programming current. For example, antifuse 6 could by programmed with a programming current from programming current terminal VppA, antifuse 7 could be programmed with a programming current from programming current terminal VppB, antifuse 8 could be programmed with a programming current from programming current terminal VppC, and antifuse 9 could be programmed with a programming current from programming current terminal VppD.

Programming current is supplied to antifuse 6 by controlling programming current multiplexer 10 to couple L-shaped VppA programming power bus 1I1 to programming bus 12. Programming driver 13 drives the voltage (VppA) on programming bus 12 onto vertically extending programming conductor 14. Likewise, programming current multiplexer 15 is controlled to couple rectangular ground bus 16 to programming bus 17. As a result, programming driver 18 drives the voltage (GND) on programming bus 17 onto vertically extending programming conductor 19. A programming control driver 20 drives a programming control conductor 21 such that programming transistors 22 and 23 are conductive. Programming current flows from programming current terminal VppA, through L-shaped VppA programming power bus 11, through programming current multiplexer 10, through programming bus 12, through programming driver 13, through programming conductor 14, through conductive programming transistor 22, through routing conductor 24, through antifuse 6, through routing conductor 25, through conductive programming transistor 23, through programming conductor 19, through programming driver 18, through programming bus 17, through programming current multiplexer 15, through rectangular ground bus 16, and to programming current terminal GND.

Antifuses 7, 8, and 9 are programmed in similar fashion with programming current multiplexers 26–31 being controlled so that the voltages indicated on FIG. 1 are supplied onto the programming conductors as indicated. Each of the four antifuses is programmed with a different programming current supplied from a different programming current terminal. Because a different programming current flows through each of the four antifuses, it can be assured that each of the four antifuses was in fact programmed with an adequately large programming current.

If antifuse 32 were, however, the antifuse chosen for simultaneous programming in logic region 3, then it could not be assured that each of the four antifuses was programmed with an adequately large programming current. Programming driver 33 would supply programming current at voltage VppD onto programming conductor 34, but it would not be known how much of this programming current flowed through antifuse 9 and how much flowed through antifuse 32. One of these antifuses may conduct all or most of the programming current such that the other antifuse is not programmed or is inadequately programmed. It is therefore seen that an antifuse in one logic region cannot necessarily be programmed simultaneously with any antifuse in another logic region. A programming architecture is sought wherein an antifuse in one logic region can be programmed at the same time that an antifuse is programmed in each of the other three logic regions irrespective of which particular other antifuses are being programmed in those other logic regions.

SUMMARY

The programmable logic of a programmable device is sectioned into four logic regions. Each logic region includes logic elements and a programmable interconnect structure employing antifuses for programmably interconnecting selected logic elements. Programming conductors for supplying programming current to antifuses of a logic region extend across the logic region but do not extend across other logic regions. Similarly, programming control conductors that control programming transistors of the logic region extend across the logic region but do not extend across other logic regions. The programmable device structure allows four antifuses to be programmed simultaneously, one antifuse in each logic region. An antifuse can be selected for simultaneous programming from a logic region, irrespective of the other three antifuises that are or may be selected for simultaneous programming from the other three logic regions. Four programming current multiplexers and four programming buses are provided for each logic region so that the programming current that programs each antifuse flows from a separate input terminal. The resistance of the programming conductors is reduced by the use of parallel strips of metal in multiple metal layers.

This summary does not purport to define the invention. The invention is defined by the claims.

DETAILED DESCRIPTION OF THE PREFERRED EMBODIMENTS

Figure 2:
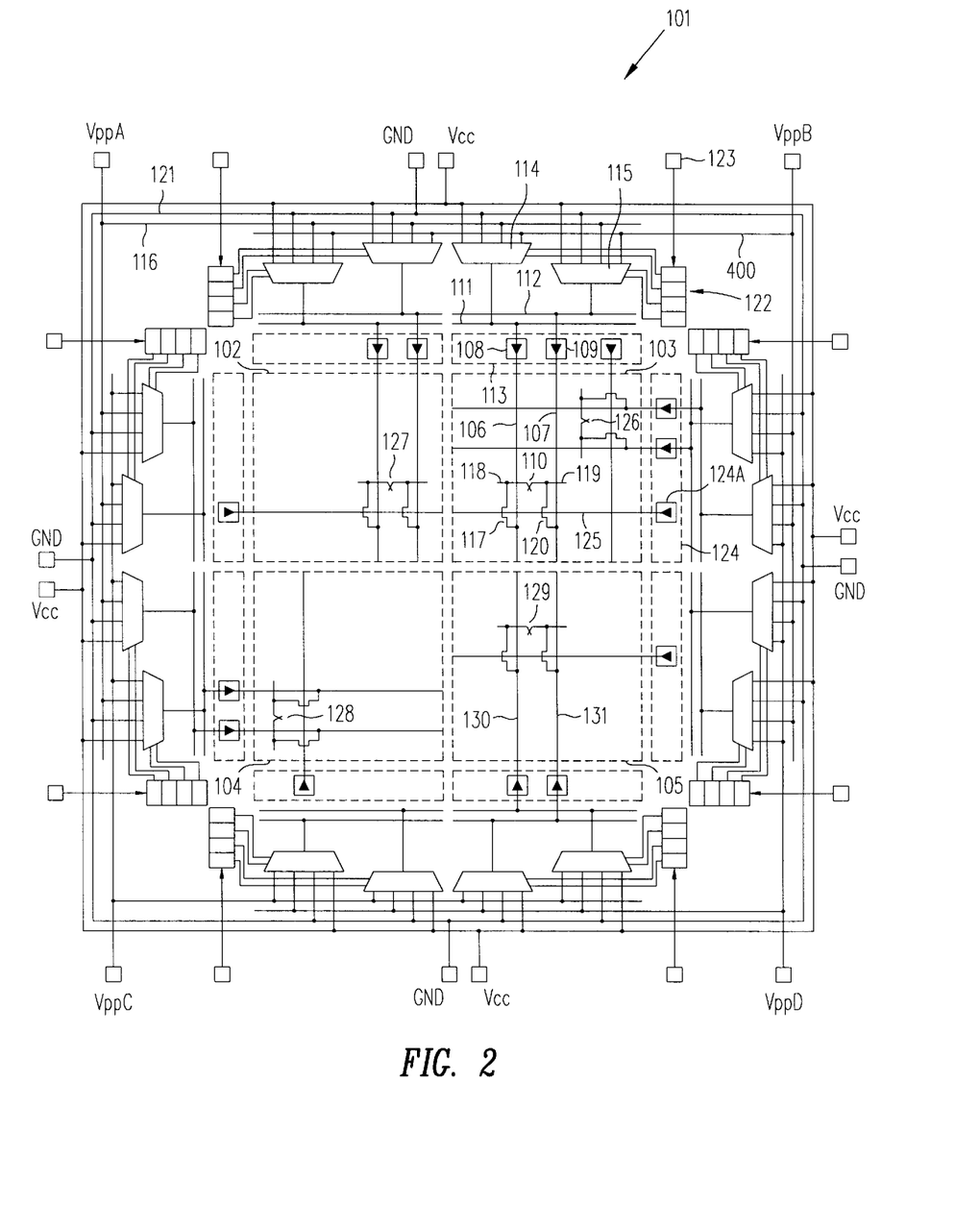
FIG. 2 is a simplified top-down diagram of an FPGA in accordance with an embodiment of the present invention.

FIG. 2 is a simplified top-down diagram of an FPGA 101 in accordance with an embodiment of the present invention. Whereas in the conventional FPGA of FIG. 1, the programming conductors (for example, programming conductors 34 and 35) extended all the way across multiple logic regions (for example, logic regions 3 and 5), in FPGA 101 the programming conductors do not extend across multiple logic regions. Additional programming drivers are supplied such that an antifuse in a logic region can be supplied with programming current from a side of that logic region without the programming current having to flow across an adjacent logic region. There are four programming buses associated with each logic region rather than two, and there are four programming current multiplexers associated with each logic region rather than two. With the architecture of FIG. 2, four antiftises can be programmed simultaneously, one in each logic region, an antifuse being selected for simultaneous programming irrespective of which particular other antifuses are to be programmed at the same time in other logic regions.

FPGA 101 comprises four rectangular logic regions 102–105 arranged in two rows and columns. (The terms "row" and "column" are relative only to each other. Logic regions 103 and 105 are disposed in a horizontally extending row if the structure of FIG. 2 is considered rotated ninety degrees from the way it is illustrated in FIG. 2.) Programming conductors extend inward across one logic region but do not extend farther across an adjacent logic region. Programming conductors 106 and 107, for example, extend downward in the vertical dimension across logic region 103 but do not extend across logic region 105. Programming drivers 108 and 109 are provided adjacent the top side of logic region 103 so that both programming conductors 106 and 107 can be driven from the top of logic region 103 without programming current having to flow across any other logic region. In order to program antifuse 110, one of the programming drivers 108 and 109 outputs programming voltage Vpp whereas the other outputs ground potential. There are therefore two programming buses 111 and 112 associated with the programming drivers of programming shift register 113. A four-to-one programming current multiplexer 114 couples programming bus 111 to one of the programming current terminals VppA, VppB, and GND. A four-to-one programming current multiplexer 115 couples programming bus 112 to another one of programming current terminals VppA, VppB, and GND. Antifuse 110 may be programmed, for example, by a programming current that flows from programming current terminal VppA, through L-shaped programming power bus 116, through programming current multiplexer 114, through programming bus 111, through programming driver 108, through programming conductor 106, through conductive programming transistor 117, through routing conductor 118, through antifuse 110, through routing conductor 119, through conductive programming transistor 120, through programming conductor 107, through programming driver 109, through programming bus 112, through programming current multiplexer 115, through rectangular ground bus 121, and out of the integrated circuit via programming current terminal GND.

In this embodiment, each of the programming current multiplexers 114 and 115 has two select input leads and are controlled by bits in an associated four-bit multiplexer control shift register 122. Multiplexer control shift register 122 is loaded serially via a terminal 123. After programming and during normal circuit operation, terminal 123 may be used as an ordinary input/output signal terminal of the integrated circuit. The programming transistors 117 and 120 are controlled by a control bit in programming shift register 124 adjacent a side of logic region 103. Control signals for the programming transistors of logic region 103 do not pass across any other logic region. The control conductor 125 extends to the left in the horizontal dimension across logic region 103 but does not extend across adjacent logic region 102.

In the example of FIG. 2, programming conductor 106 of logic region 103 extends in the vertical dimension and is collinear with respect to a programming conductor 130 of logic region 105 and programming conductor 107 of logic region 103 extends in the vertical dimension and is collinear with respect to another programming conductor 131 of logic region 105. Also, the antifuses illustrated are pass antifuses in that they can be programmed to couple collinearly extending routing conductors together end to end (routing conductor 118 is collinear with respect to routing conductor 119). The configurable interconnect structure of FPGA 101 also comprises cross antifuses where horizontally extending routing conductors as cross vertically extending routing conductors. Only a select few of the routing conductors and antifuses of the programmable interconnect structure are shown in FIG. 2 to eliminate clutter from the illustration and to clarify the explanation of the invention. Some of the routing conductors extend from one logic region to another logic region. See U.S. Pat. No. 5,825,201 (the subject matter of which is incorporated herein by reference) for further details of a programmable interconnect structure. In some embodiments, FPGA 101 includes test structures for testing the integrity of the programming conductors, the programming control conductors and the routing conductors in an unprogrammed FPGA. See U.S. patent application Ser. No. 08/667,702 (the subject matter of which is incorporated herein by reference) for further details on examples of such test structures.

Some of the antifuses (for example, antifuse 126) of logic region 103 are programmed via horizontally extending programming conductors rather than vertically extending programming conductors. The programming driver, programming bus and programming multiplexer structure associated with antifuse 110 is therefore repeated to the right of logic region 103 except that it is rotated ninety degrees.

In contrast to the conventional structure of FIG. 1 where antifuses 6, 32, 8, and 9 cannot be programmed reliably at the same time, in the structure of FIG. 2 antifuses 127, 110, 128, and 129 can all be programmed simultaneously, the programming current for each antifuse being supplied via a different programming current terminal. For example, antifuse 127 can receive its programming current from terminal VppA, antifuse 110 can receive its programming current from terminal VppB, antifuse 129 can receive its programming current from terminal VppD, and antifuse 128 can receive its programming current from terminal VppC. One antifuse can be selected for simultaneous programming in each of the four logic regions and this antifuse can be selected irrespective of which particular other three antifuses are to be simultaneously programmed in the other logic regions. An antifuse may be programmed by conducting a pulse of programming current through the antifuse in one direction (for example, through antifuse 110 from routing conductor 118 to routing conductor 119) and then subsequently conducting a pulse of programming current through the antifuse in the opposite direction (for example, through antifuse 110 from routing conductor 119 to routing conductor 118). In some embodiments, the direction of programming current flow is reversed by reloading the controlling multiplexer control shift register bits prior to the subsequent programming current pulse.

Figure 3:
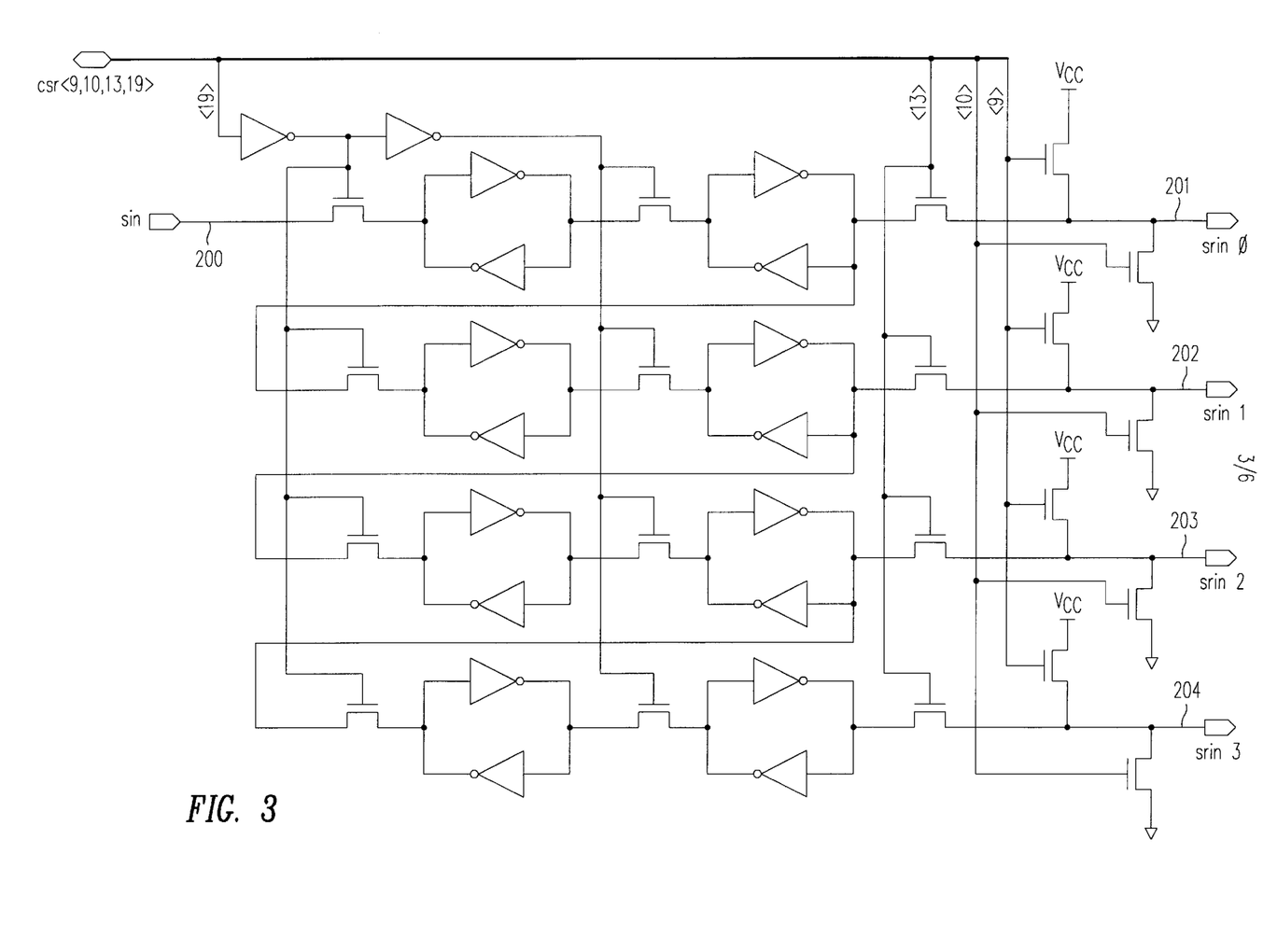
FIG. 3 is a simplified circuit diagram of a multiplexer control shift register of the FPGA of FIG. 2.

FIG. 3 is a circuit diagram of a multiplexer control shift register such as multiplexer control shift register 122. Input lead 200 is a serial input lead, labeled sin, for receiving a serial programming data from a terminal such as terminal 123. The four data output leads 201–204 are coupled to four corresponding select input leads of two programming current multiplexers such as multiplexers 114 and 115. Control signal csr<19> is a clock signal that clocks the multiplexer control shift register. Control signal csr<13> is high when the output of the multiplexer control shift register is to control the programming current multiplexers. Control signal csr<10> is high during normal circuit operation and couples the shift register output leads 201–204 to ground potential. Control signal csr<9> is high during precharging of programming conductors in shift mode so that output leads 201–204 will be coupled to voltage Vcc. Control signal csr<9> is low during antifuse programming.

Figure 4:
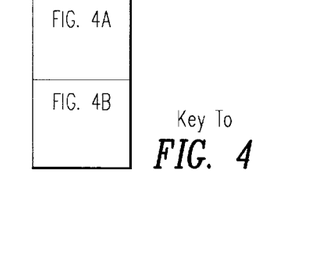
FIG. 4 is a simplified circuit diagram of two programming current multiplexers of the FPGA of FIG. 2.
Figure 4A:
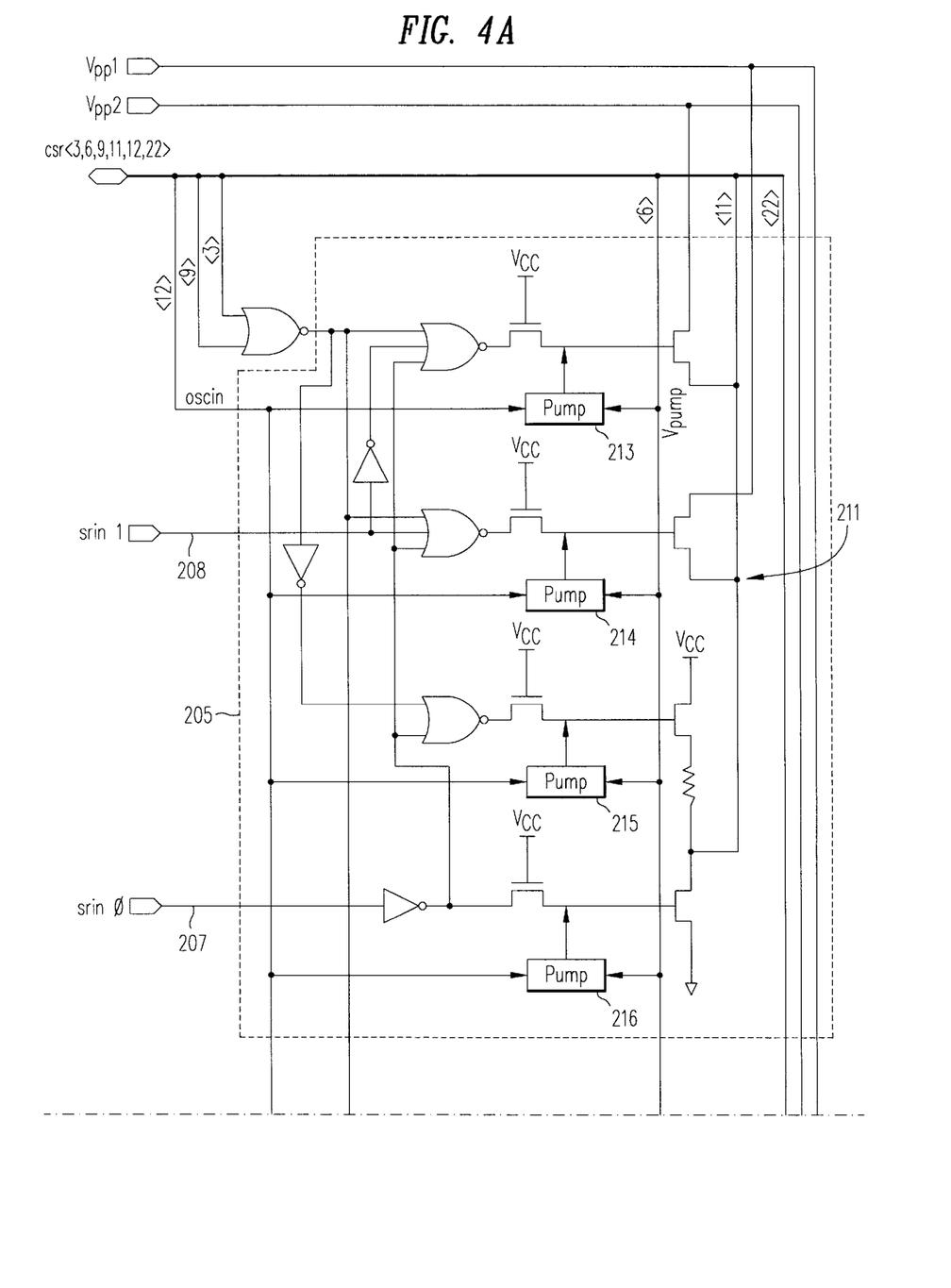
Figure 4B:
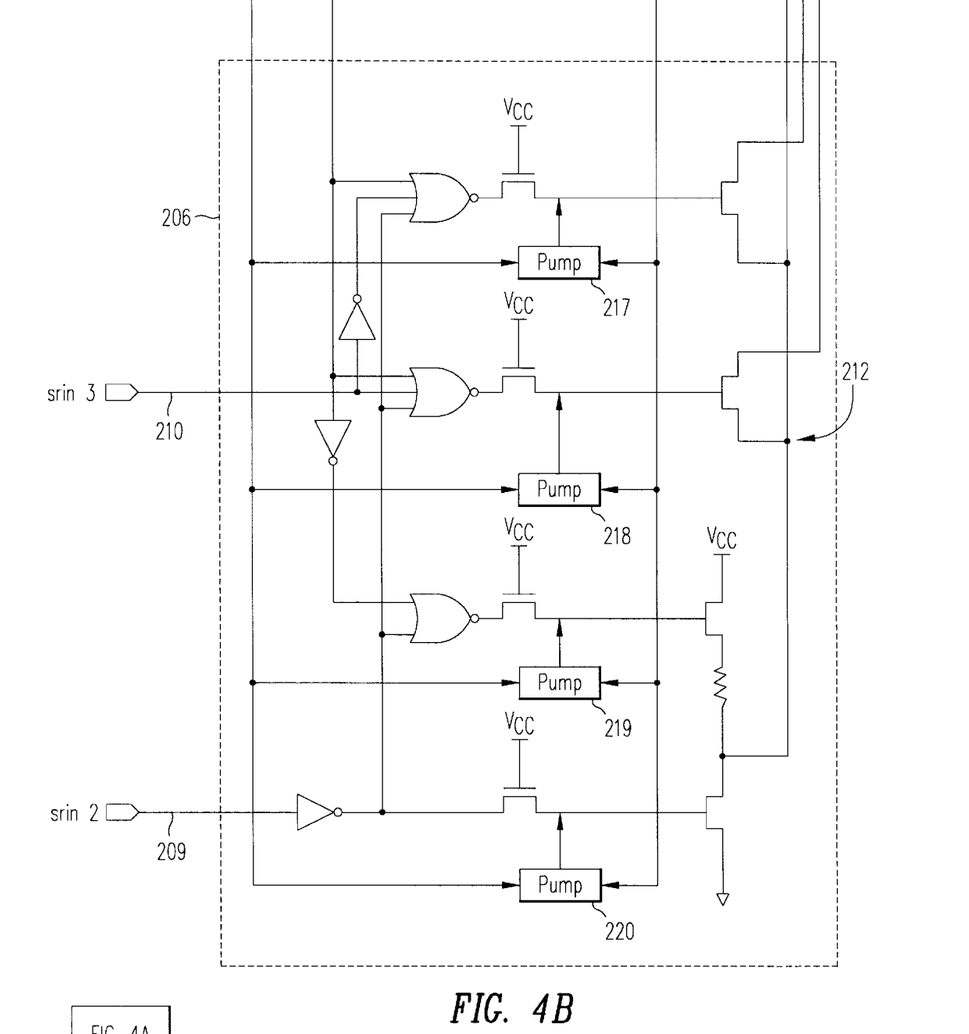

FIG. 4 is a circuit diagram of two programming current multiplexers 205 and 206 such as programming current multiplexers 114 and 115. Select input leads 207–210 of the programming current multiplexers of FIG. 4 are coupled to data output leads 201–204 of the multiplexer control shift register of FIG. 3, respectively. Leads 211 and 212 are output leads of multiplexers 205 and 206 respectively. Control signal csr<12> is an oscillating signal for driving charge pumps 213–220. Control signal csr<6> is a pumped voltage Vpump from another charge pump (not shown) that is in turn pumped by the charge pumps 213–220. Control signal csr<9> is explained above in connection with FIG. 3. Control signal csr<3>is a control signal that is high during antifuse programming. Output leads csr<11> and csr<22> are the output leads of programming current multiplexers 205 and 206, respectively. Input leads Vpp1 and Vpp2 are coupled to the two L-shaped Vpp programming power buses that extend along a side of the integrated circuit between the side of the integrated circuit and the programming current multiplexers. If programming current multiplexers 205 and 206 are, for example, programming current multiplexers 114 and 115 of FIG. 2, then Vpp1 and Vpp2 are coupled to L-shaped Vpp programming power buses 116 and 400.

Figure 5:
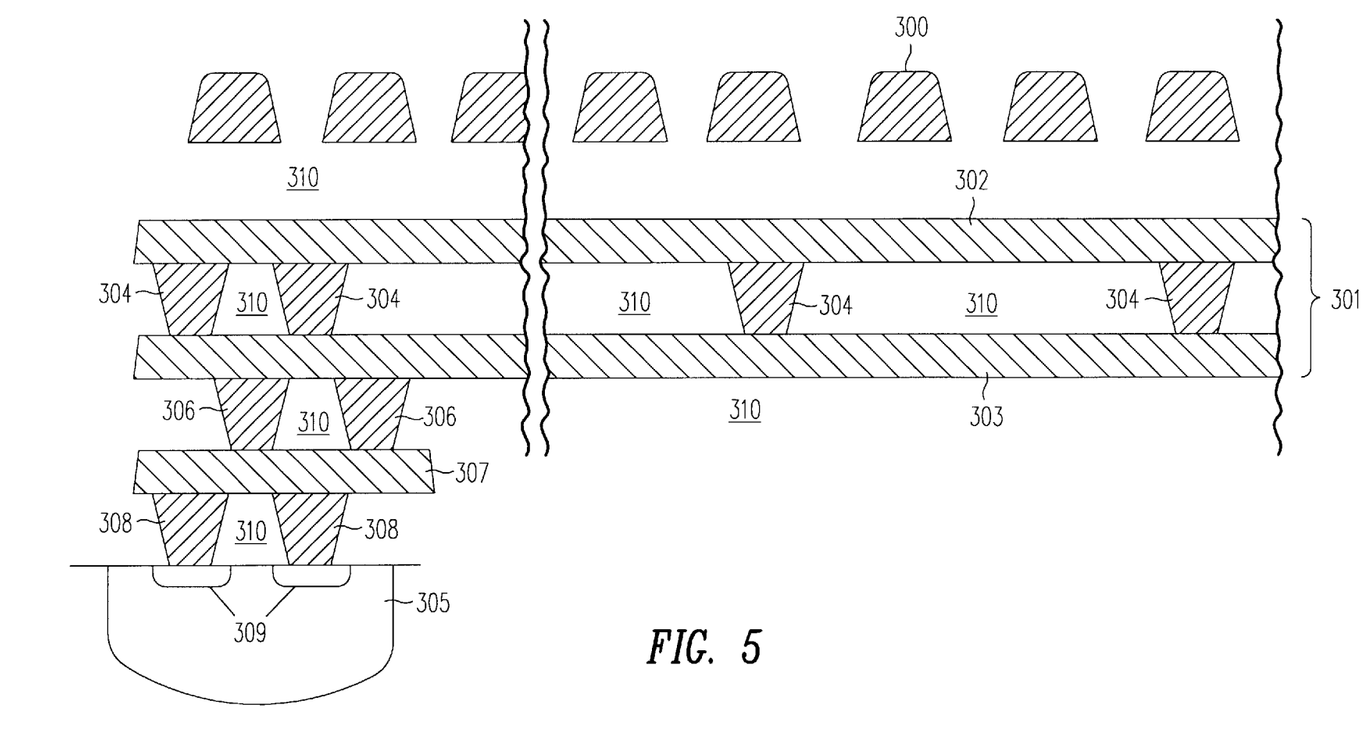
FIG. 5 is a simplified cross-sectional diagram illustrating a portion of an FPGA in accordance with an embodiment of the present invention.

FIG. 5 is a simplified cross-sectional diagram illustrating a portion of an FPGA in accordance with an embodiment of the present invention. Teachings in accordance with the present invention may be used to shorten programming conductors, reduce programming conductor resistance, and/or allow for the use of thinner programming conductors. Each horizontally extending programming conductor 300 is realized as a strip of metal layer 4. Metal 4 is approximately 8000 angstroms thick in one example. Each vertically extending programming conductor 301, on the other hand, is realized as a strip 302 of metal and a strip 303 of metal. These two strips 302 and 303 are coupled together in parallel by to vias 304 disposed at periodic intervals along the vertically extending programming conductor 301. Parallel strips reduce series resistance of the programming conductors. Strip 302 of metal and strip 303 of metal are each approximately 4000 angstroms thick in one embodiment. FIG. 5 shows vertically extending programming conductor 301 being coupled to a source 305 of a programming transistor in the substrate through vias 306, a portion 307 of metal layer, and contacts 308. Regions 309 is a shallow layer of titanium silicide. In one embodiment, portion 307 of metal is approximately 4000 angstroms thick. The vias and contacts may be realized as plugs of tungsten that are disposed in openings in intermetal layer insulator 310. Conductive plugs and antifuses can be fabricated in accordance with techniques set forth in the U.S. Pat. No. 6,107,165, issued Aug. 22, 2000 entitled "Metal-to-Metal Antifuse Having Improved Barrier Layer", by Rajiv Jain et al., (the subject matter of this application is incorporated herein by reference).

Although the invention is described in connection with certain specific embodiments for instructional purposes, the invention is not limited to the specific embodiments. Accordingly, modifications, adaptations and combinations of various features of the described specific embodiments can be practiced without departing from the scope of the invention as set forth in the claims.

What is claimed is:

1. An integrated circuit, comprising:

a first logic region and a second logic region disposed in a row, the row extending in a first dimension, the first logic region comprising a first programming transistor, a first routing conductor, a first antifuse, a second programming transistor, and a second routing conductor, the second logic region comprising a third programming transistor, a third routing conductor, a second antifuse, a fourth routing conductor, and a fourth programming transistor;

a first programming conductor extending in the first dimension across the first logic region and toward the second logic region, the first programming conductor being coupled to the first programming transistor, the first programming conductor not being coupled to any programming transistor in the second logic region;

a second programming conductor extending parallel to the first programming conductor in the first dimension across the first logic region and toward the second logic region, the second programming conductor being coupled to the second programming transistor, the second programming conductor not being coupled to any programming transistor in the second logic region, the first antifuse being programmable by conducting a programming current through the first programming conductor, through the first programming transistor, through the first routing conductor, through the first antifuse, through the second routing conductor, through the second programming transistor, and through the second programming conductor to couple the first routing conductor to the second routing conductor;

a third programming conductor extending in the first dimension across the second logic region and toward the first logic region, the third programming conductor being coupled to the third programming transistor, the third programming conductor not being coupled to any programming transistor in the first logic region; and a fourth programming conductor extending parallel to the third programming conductor in the first dimension across the second logic region and toward the first logic region, the fourth programming conductor being coupled to the fourth programming transistor, the fourth programming conductor not being coupled to any programming transistor in the first logic region, the second antifuse being programmable by conducting a programming current through the third programming conductor, through the third programming transistor, through the third routing conductor, through the second antifuse, through the fourth routing conductor, through the fourth programming transistor, and through the fourth programming conductor to couple the third routing conductor to the fourth routing conductor.

2. The integrated circuit of claim 1, wherein the first programming conductor is collinear with the third programming conductor, the second programming conductor being collinear with the fourth programming conductor.

3. The integrated circuit of claim 1, wherein the first logic region has a rectangular shape with four sides, the second logic region having four sides and having the same rectangular shape that the first logic region has, a first side of the first logic region extending in the first dimension and being collinear with a first side of the second logic region, a second side of the first logic region extending in the first dimension and being collinear with a second side of the second logic region.

4. The integrated circuit of claim 3, wherein the first programming conductor does not extend across the second logic region, the second programming conductor does not extend across the second logic region, the third programming conductor does not extend across the first logic region, and the fourth programming conductor does not extend across the first logic region.

5. The integrated circuit of claim 3, further comprising:
   a first programming control conductor extending in a second dimension perpendicular to the first dimension, the first and second programming transistors having gate electrodes, the first programming control conductor being coupled to the gate electrodes of the first and second programming transistors; and
   a second programming control conductor extending in the second dimension parallel to the first programming control conductor, the third and fourth programming transistors having gate electrodes, the second programming control conductor being coupled to the gate electrodes of the third and fourth programming transistors.

6. The integrated circuit of claim 1, further comprising:
   a first programming bus;
   a first programming current multiplexer having a first input lead, a second input lead, a select input lead, and an output lead coupled to the first programming bus;
   a first programming driver having an input lead coupled to the first programming bus and an output lead coupled to the first programming conductor;
   a second programming bus;
   a second programming current multiplexer having a first input lead, a second input lead, a select input lead, and an output lead coupled to the second programming bus;
   a second programming driver having an input lead coupled to the second programming bus and an output lead coupled to the second programming conductor;
   a third programming bus;
   a third programming current multiplexer having a first input lead, a second input lead, a select input lead, and an output lead coupled to the third programming bus;
   a third programming driver having an input lead coupled to the third programming bus and an output lead coupled to the third programming conductor;
   a fourth programming bus;
   a fourth programming current multiplexer having a first input lead, a second input lead, a select input lead, and an output lead coupled to the fourth programming bus; and
   a fourth programming driver having an input lead coupled to the fourth programming bus and an output lead coupled to the fourth programming conductor.

7. The integrated circuit of claim 6, further comprising:
   a first programming current terminal coupled to the first input lead of the first programming current multiplexer and to the first input lead of the second programming current multiplexer;
   a second programming current terminal coupled to the second input lead of the first programming current multiplexer and to the second input lead of the second programming current multiplexer;
   a third programming current terminal coupled to the first input lead of the third programming current multiplexer and to the first input lead of the fourth programming current multiplexer; and
   a fourth programming current terminal coupled to the second input lead of the third programming current multiplexer and to the second input lead of the fourth programming current multiplexer.

8. The integrated circuit of claim 7, wherein the first programming current terminal is a ground terminal.

9. The integrated circuit of claim 6, further comprising:
   a first plurality of programming drivers disposed in a column extending in the second dimension, the first and second programming drivers being ones of the first plurality of programming drivers; and
   a second plurality of programming drivers disposed in a column extending in the second dimension, the third and fourth programming drivers being ones of the second plurality of programming drivers.

10. The integrated circuit of claim 1, wherein the first programming conductor extends over the first routing conductor, the second programming conductor extends over the second routing conductor, the third programming conductor extends over the third routing conductor, and the fourth programming conductor extends over the fourth routing conductor.

11. The integrated circuit of claim 1, wherein the first programming conductor extends under the first routing conductor, the second programming conductor extends under the second routing conductor, the third programming conductor extends under the third routing conductor, and the fourth programming conductor extends under the fourth routing conductor.

12. The integrated circuit of claim 1, wherein the integrated circuit is a field programmable gate array, wherein the first logic region comprises a plurality of logic cells and a programmable interconnect structure, the first routing conductor, the first antifuse, and the second routing conductor being part of the programmable interconnect structure of the first logic region, and wherein the second logic region comprises a plurality of logic cells and a programmable interconnect structure, the third routing conductor, the second antifuse, and the fourth routing conductor being part of the programmable interconnect structure of the second logic region.

13. The integrated circuit of claim 1, wherein the integrated circuit comprises a first layer of metal and a second layer of metal, an intermetal layer insulator being disposed between the first layer of metal and the second layer of metal, wherein the first programming conductor comprises a strip of metal of said first layer of metal and a strip of metal of said second layer of metal, said strip of metal of said first layer and said strip of metal of said second layer extending in parallel to one another, said first programming conductor further comprising a plurality of conductive plugs disposed along said first programming conductor to couple said strip of metal of said first layer to said strip of metal of said second layer through said intermetal layer insulator at a plurality of locations along said programming conductor.

14. The integrated circuit of claim 13, wherein there are more than three of said plurality of conductive plugs.

15. A method of simultaneously programming four antifuses of a field programmable gate array (FPGA), the FPGA having four logic regions, the method comprising:
   conducting a first programming current from a first terminal of the integrated circuit, through a first programming current multiplexer, through a first programming conductor, through a first of the four antifuses, through a second programming conductor, through a second programming current multiplexer, and to a second terminal of the integrated circuit, wherein the first of the four antifuses is disposed in a first of the four logic regions, and neither the first nor the second programming conductor extend into a second, a third, or a fourth of the logic regions;

conducting a second programming current from a third terminal of the integrated circuit, through a third programming current multiplexer, through a third programming conductor, through a second of the four antifuses, through a fourth programming conductor, through a fourth programming current multiplexer, and to the second terminal of the integrated circuit, wherein the second of the four antifuses is disposed in the second of the four logic regions, and neither the third nor the fourth programming conductor extend into the first, third, or fourth of the logic regions;

conducting a third programming current from a fourth terminal of the integrated circuit, through a fifth programming current multiplexer, through a fifth programming conductor, through a third of the four antifuses, though a sixth programming conductor, through a sixth programming current multiplexer, and to the second terminal of the integrated circuit, wherein the third of the four antifuses is disposed in the third of the four logic regions, and neither the fifth nor the sixth programming conductor extend into the first, second, or fourth of the logic regions; and conducting a fourth programming current from a fifth terminal of the integrated circuit, through a seventh programming current multiplexer, through a seventh programming conductor, through a fourth of the four antifuses, through an eighth programming conductor, through an eighth programming current multiplexer, and to the second terminal of the integrated circuit, wherein the fourth of the four antifuses is disposed in the fourth of the four logic regions, and neither the seventh nor the eighth programming conductor extend into the second, third, or fourth of the logic regions.

16. The method of claim 15, wherein the second terminal is a ground terminal.

17. The method of claim 15, wherein the first and second programming, conductor extend parallel to each other.

18. The method of claim 15, wherein the first and second programming conductors extend perpendicularly to each other.

19. An integrated circuit, comprising:

a logic array having a first logic region, a second logic region, a third logic region, and a fourth logic region; and means for simultaneously programming any one first antifuse in the first logic region at the same time that a second antifuse is programmed in the second logic region, a third antifuse is programmed in the third logic region, and a fourth antifuse is programmed in the fourth logic region;

wherein the means also supply a first programming current to the first antifuse from a first programming current terminal, a second programming current to the second antifuse from a second programming current terminal, a third programming current to the third antifuse from a third programming current terminal, and a fourth programming current to the fourth antifuse from a fourth programming current terminal; and wherein the first programming current does not flow through the second, third, or fourth logic regions, the second programming current does not flow through the first, third, or fourth logic regions, the third programming current does not flow through the first, second, or fourth logic regions, and the fourth programming current does not flow through the first, second, or third logic regions.

20. The integrated circuit of claim 19, wherein the means comprises:

a first set of four programming buses and four programming current multiplexers associated with the first logic region;

a second set of four programming buses and four programming current multiplexers associated with the second logic region;

a third set of four programming buses and four programming current multiplexers associated with the third logic region; and a fourth set of four programming buses and four programming current multiplexers associated with the fourth logic region.

21. The integrated circuit of claim 19, wherein the first logic region and the second logic region are disposed in a row that extends in a first dimension, and wherein the first logic region and the third logic region are disposed in a column that extends in a second dimension perpendicular to the first dimension, wherein an axis extending in the first dimension intersects both the first antifuse and the second antifuse.

22. The integrated circuit of claim 19, wherein the first logic region and the second logic region are disposed in a row that extends in a first dimension, and wherein the first logic region and the third logic region are disposed in a column that extends in a second dimension perpendicular to the first dimension, wherein an axis extending in the second dimension intersects both the first antifuse and the third antifuse.

23. The integrated circuit of claim 19, wherein the first programming current flows through a first two programming current multiplexers of the means, the second programming current flows through a second two programming current multiplexers of the means, the third programming current flows through a third two programming current multiplexers of the means, and the fourth programming current flows through a fourth two programming current multiplexers of the means.

* * * * *